United States Patent
Kim et al.

(10) Patent No.: US 7,998,810 B2
(45) Date of Patent: Aug. 16, 2011

(54) METHODS OF FORMING INTEGRATED CIRCUIT DEVICES HAVING STACKED GATE ELECTRODES

(75) Inventors: Byung-hee Kim, Seoul (KR); Gil-heyun Choi, Seoul (KR); Sang-woo Lee, Seoul (KR); Chang-won Lee, Gyeonggi-do (KR); Jin-ho Park, Gyeonggi-do (KR); Eun-ji Jung, Gyeongi-do (KR); Jeong-gil Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 105 days.

(21) Appl. No.: 12/424,922

(22) Filed: Apr. 16, 2009

(65) Prior Publication Data

US 2009/0325371 A1     Dec. 31, 2009

(30) Foreign Application Priority Data

Jun. 30, 2008    (KR) ........................ 10-2008-0062866

(51) Int. Cl.
     *H01L 21/336*      (2006.01)

(52) U.S. Cl. ........ 438/257; 438/587; 438/588; 438/592; 438/593; 438/594; 257/E21.409

(58) Field of Classification Search .................. 438/263, 438/264, 588, 591–594, 257; 257/E21.409
See application file for complete search history.

(56) References Cited

U.S. PATENT DOCUMENTS

| | | | |
|---|---|---|---|
| 6,159,797 A * | 12/2000 | Lee | 438/257 |
| 6,251,729 B1 | 6/2001 | Montree et al. | |
| 6,291,301 B1 * | 9/2001 | Chen | 438/303 |
| 7,622,349 B2 * | 11/2009 | Sadd et al. | 438/257 |
| 2008/0048245 A1 * | 2/2008 | Kito et al. | 257/321 |
| 2008/0116503 A1 * | 5/2008 | Tsurumi et al. | 257/316 |
| 2009/0001444 A1 * | 1/2009 | Matsuoka et al. | 257/316 |
| 2009/0191699 A1 * | 7/2009 | Jung et al. | 438/592 |

FOREIGN PATENT DOCUMENTS

| | | |
|---|---|---|
| JP | 2003-007861 | 1/2003 |
| KR | 1020030044145 A | 6/2003 |

* cited by examiner

*Primary Examiner* — Charles D Garber
*Assistant Examiner* — Angel Roman
(74) *Attorney, Agent, or Firm* — Myers Bigel Sibley & Sajovec (57) ABSTRACT

A method of forming a gate electrode of a semiconductor device is provided, the method including: forming a plurality of stacked structures each comprising a tunnel dielectric layer, a first silicon layer for floating gates, an intergate dielectric layer, a second silicon layer for control gates, and a mask pattern, on a semiconductor substrate in the stated order; forming a first interlayer dielectric layer between the plurality of stacked structures so that a top surface of the mask pattern is exposed; selectively removing the mask pattern of which the top surface is exposed; forming a third silicon layer in an area from which the hard disk layer was removed, and forming a silicon layer comprising the third silicon layer and the second silicon layer; recessing the first interlayer dielectric layer so that an upper portion of the silicon layer protrudes over the he first interlayer dielectric layer; and forming a metal silicide layer on the upper portion of the silicon layer.

20 Claims, 5 Drawing Sheets

METHODS OF FORMING INTEGRATED CIRCUIT DEVICES HAVING STACKED GATE ELECTRODES

REFERENCE TO PRIORITY APPLICATION

This application claims the benefit of Korean Patent Application No. 10-2008-0062866, filed Jun. 30, 2008, in the Korean Intellectual Property Office, the disclosure of which is hereby incorporated herein by reference.

BACKGROUND

As a feature size of a control gate of flash memories decreases due to high integration of flash memories, a resistance of the control gate increases and thus problems, such as an RC delay and a voltage drop may occur. To address these problems, a metal layer is formed on a polysilicon layer and thermally treated to form a metal silicide layer. Thus, a control gate having a structure in which a metal silicide layer and a polysilicon layer are stacked has been introduced.

To obtain a resistance required for a control gate when a design rule is less than or equal to 50 nm, a thick metal silicide layer of 500Å or greater needs to be formed. However, as a silicidation reaction occurs for a narrow line width, voids are formed within the control gate or the profile of silicide deteriorates.

SUMMARY

The inventive concept provides a method of manufacturing a semiconductor device, by which an interlayer dielectric layer can be formed within a narrow space between stacked gate structures, without generating voids within the interlayer dielectric layer, thus contributing to uniform recessing of the interlayer dielectric layer and formation of a metal silicide layer with a uniform shape, and by which formation of the metal silicide layer within an undesired region of an active region of a semiconductor substrate due to pitting generated in the semiconductor substrate can be prevented.

According to an aspect of the inventive concept, there is provided a method of forming a gate electrode of a semiconductor device, the method comprising: forming a plurality of stacked structures each comprising a tunnel dielectric layer, a first silicon layer for floating gates, an intergate dielectric layer, a second silicon layer for control gates, and a hard mask layer, on a semiconductor substrate in the stated order; forming a first interlayer dielectric layer between the plurality of stacked structures so that a top surface of the hard mask layer is exposed; selectively removing the hard mask layer of which the top surface is exposed in the first interlayer dielectric layer; and forming a third silicon layer for control gates in an area from which the hard mask layer was removed to form a silicon layer for control gates which comprises the third silicon layer and the second silicon layer.

The method may further include: recessing the first interlayer dielectric layer so that an tipper portion of the silicon layer protrudes over the first interlayer dielectric layer; and forming a metal silicide layer for the upper portion of the silicon layer. Alternatively, the method may further include: sequentially forming a first dielectric layer, a first silicon layer, a second dielectric layer, a second silicon layer, and a mask layer on the semiconductor substrate in the stated order; forming the mask pattern by patterning the mask layer; and etching the first dielectric layer, the first silicon layer, the second dielectric layer, and the second silicon layer by using the mask pattern as an etch mask, so as to form the tunnel dielectric layer, the first silicon layer, the intergate dielectric layer, and the second silicon layer. The first dielectric layer may include a silicon oxide layer, the second dielectric layer may include an oxide-nitride-oxide (ONO) layer, and the mask layer may include a silicon nitride layer.

The forming of the first interlayer dielectric layer may include: depositing a dielectric material for the first interlayer dielectric layer in spaces between the plurality of stacked structures so as to fill the spaces between the plurality of stacked structures: and performing chemical mechanical polishing (CMP) on the deposited dielectric material for the first interlayer dielectric layer by using the mask pattern as an CMP stop layer.

The first interlayer dielectric layer may include a Medium Temperature Oxide (MTO) layer or a Tetra-Ethyl-Ortho-Silicate (TEOS) oxide layer.

The mask pattern may be selectively removed using a wet etching technique using phosphoric acid.

The forming of the third silicon layer in the area from which the mask pattern was removed may include: forming polysilicon on the semiconductor substrate so as to fill the area from which the mask pattern was removed; and performing CMP on the polysilicon so that the first interlayer dielectric layer is exposed. Alternatively, the forming of the third silicon layer in the area from which the mask pattern was removed may include: growing epitaxial silicon on the second silicon layer by selective epitaxial growth (SEG); and performing CMP on the grown epitaxial silicon so that the first interlayer dielectric layer is exposed.

The forming of the metal silicide layer may include: forming a metal layer on the semiconductor substrate from which the silicon layer protrudes over the first interlayer dielectric layer; thermally treating the semiconductor substrate on which the metal layer has been formed; and removing a portion of the metal layer that does not react to the thermal treatment and remains without turning into the metal silicide layer. The metal layer may include at least one metal selected from the group consisting of Co, Ni, Ti, Hf, NiTa, and NiPt.

According to another aspect of the inventive concept, there is provided a method of forming a gate electrode of a semiconductor device, the method including: forming a plurality of stacked structures each comprising a tunnel dielectric layer, a silicon layer for floating gates, an intergate dielectric layer, and a mask pattern, on a semiconductor substrate in the stated order; forming a first interlayer dielectric layer between the plurality of stacked structures so that a top surface of the mask pattern is exposed; selectively removing the mask pattern of which the top surface is exposed; forming a silicon layer for control gates in an area from which the mask pattern was removed; recessing the first interlayer dielectric layer so that an upper portion of the silicon layer protrudes over the first interlayer dielectric layer; and forming a metal silicide layer for the upper portion of the silicon layer.

The forming of the plurality of stacked structures may include: sequentially forming a first dielectric layer, a first silicon layer, a second dielectric layer, and a mask layer; forming the mask pattern by patterning the mask layer; and etching the first dielectric layer, the first silicon layer, and the second dielectric layer by using the mask pattern as an etch mask, so as to form the tunnel dielectric layer, the silicon layer, and the intergate dielectric layer.

The first dielectric layer may include a silicon oxide layer, the second dielectric layer comprises an ONO layer, and the mask layer comprises a silicon nitride layer.

The forming of the silicon layer in the area from which the mask pattern was removed may include: forming polysilicon on the semiconductor substrate so as to fill the area from which the hard disk layer was removed; and performing CMP on the polysilicon so that the first interlayer dielectric layer is exposed.

The forming of the metal silicide layer on the silicon layer may include: forming a metal layer on the semiconductor substrate from which the silicon layer protrudes over the first interlayer dielectric layer; thermally treating the semiconductor substrate on which the metal layer has been formed; and removing a portion of the metal layer that does not react to the thermal treatment and remains without turning into the metal silicide layer.

The metal layer may include at least one metal selected from the group consisting of Co, Ni, Ti, Hf, NiTa, and NiPt.

The forming of the metal silicide layer may include: forming a metal layer on the semiconductor substrate from which the silicon layer protrudes over the first interlayer dielectric layer; thermally treating the semiconductor substrate on which the metal layer has been formed; and removing a portion of the metal layer that does not react to the thermal treatment and remains without turning into the metal silicide layer. Alternatively, the forming of the metal silicide layer may include turning the entire silicon layer into the metal silicide layer.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

The inventive concept will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to one skilled in the art. In the drawings, the thicknesses of layers and regions are exaggerated for clarity. Like reference numerals in the drawings denote like elements, and thus their description will be omitted.

FIGS. 1A through 1H are cross-sectional views illustrating a method of forming a control gate of a flash memory, according to an embodiment of the inventive concept.

Figure 1A:
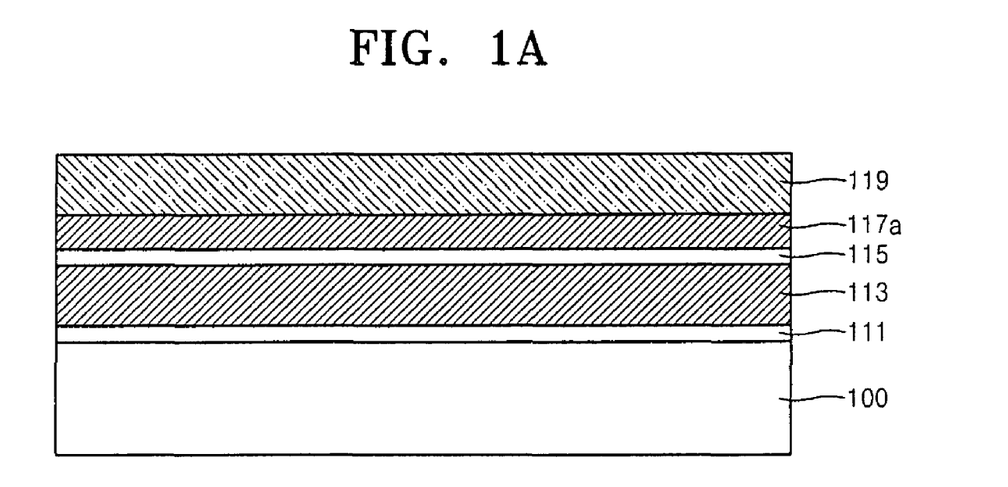
FIGS. 1A through 1H are cross-sectional views illustrating a method of forming a control gate of a flash memory, according to an embodiment of the inventive concept.

Referring to FIG. 1A, a tunnel dielectric layer 111, a first silicon layer 113 for floating gates, an intergate dielectric layer 115, a second silicon layer 117a for control gates, and a hard mask layer 119 are sequentially formed on a semiconductor substrate 100 in the order stated. The tunnel dielectric layer 111 may be formed of a silicon oxide layer by thermal oxidation or chemical vapor deposition (CVD), or formed of a material having a low dielectric constant. The intergate dielectric layer 115 may be an oxide-nitride-oxide (ONO) layer, which is a stack of a silicon oxide layer, a silicon nitride layer, and a silicon oxide layer. The first silicon layer 113 and the second silicon layer 117a may be formed of polysilicon.

The second silicon layer 117a is formed to be lower in height than a control gate that is to be finally formed. The hard mask layer 119 may be formed of a material having etching selectivity to silicon or a silicon oxide layer, for example, may be formed of silicon nitride. The hard mask layer 119 may be formed to have a height corresponding to a result obtained by subtracting the height of the second silicon layer 117a from that of the final control gate. For example, if the height of the final control gate is 1500Å the second silicon layer 117a may be formed to have a height of 500Å and the hard mask layer 119 may be formed to have a height of 1000Å. Accordingly, a sum of the heights of the second silicon layer 117a and the hard mask layer 119 is equal to the height of the final control gate.

Figure 1B:
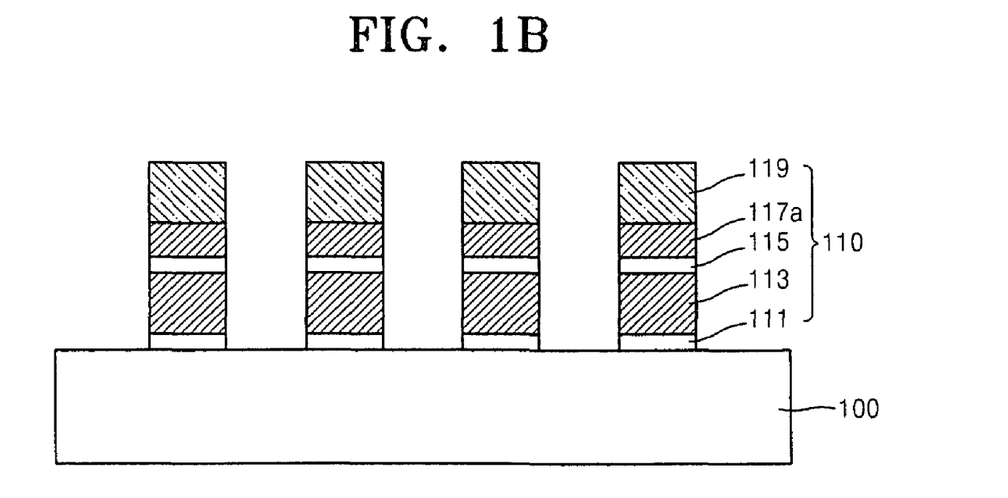

Referring to FIG. 1B, the tunnel dielectric layer 111, the first silicon layer 113, the intergate dielectric layer 115, the second silicon layer 117a, and the hard mask layer 119 are patterned to form stacked gate structures 110. At this time, the hard mask layer 119 may be first patterned, and then the remaining stacked layers below the hard mask layer 119 may be etched using the patterned hard mask layer 119 as an etch mask. The hard mask layer 119 may also serve as a sacrificial pattern for forming a third silicon layer 117b for control gates (see FIG. 1E), after serving as the etch mask to form the stacked gate structures 110.

Figure 1C:
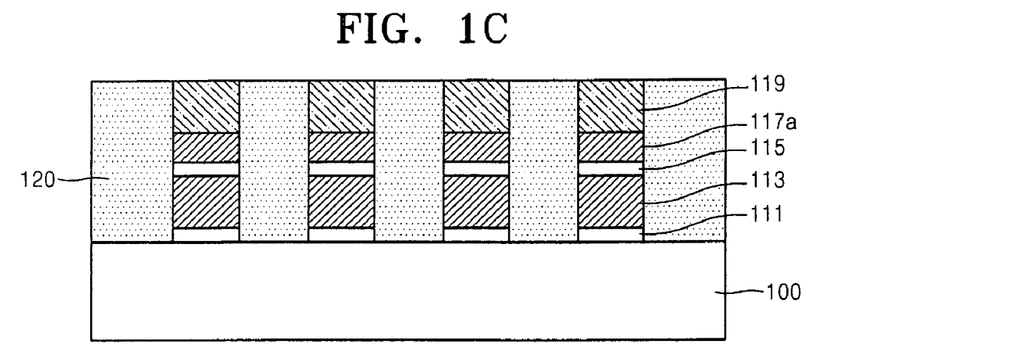

Referring to FIG. 1C, a first interlayer dielectric layer 120 is formed between the stacked gate structures 110. The first interlayer dielectric layer 120 may be formed by depositing a material for the first interlayer dielectric layer 120 on the semiconductor substrate 100 on which the stacked gate structures 110 have been formed and performing chemical mechanical polishing (CMP) on the material for the first interlayer dielectric layer 120 by using the hard mask layer 119 as an CMP stop layer. According to the CMP, the hard mask layer 119 is exposed on the top surface of the first interlayer dielectric layer 120. The material for the first interlayer dielectric layer 120 may be silicon oxide including Medium Temperature Oxide (MTO) or Tetra-Ethyl-Ortho-Silicate (TEOS).

In the present embodiment, since the sum of the heights of the second silicon layer 117a and the hard mask layer 119 is equal to the height of the final control gate, the height of the stacked gate structures 110 is decreased, and thus an aspect ratio between stacked gate structures 110 is lowered. Therefore, when the material for the first interlayer dielectric layer 120 is deposited between the stacked gate structures 110, overhangs are not generated, and thus voids are not formed within the first interlayer dielectric layer 120.

Figure 1D:
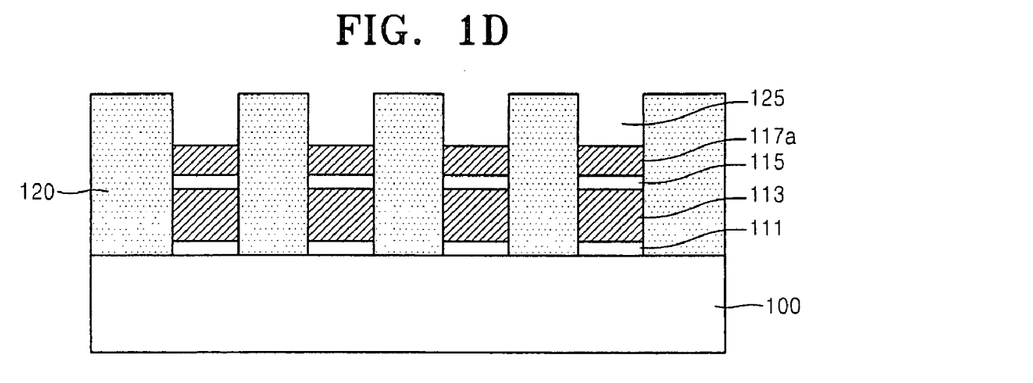

Referring to FIG. 1D, the hard mask layer 119 exposed on the top surface of the first interlayer dielectric layer 120 is removed. The hard mask layer 119 may be selectively removed according to a wet etching method using phosphoric acid. When the hard mask layer 119 is removed, trenches 125 are formed in the first interlayer dielectric layer 120, and the top surface of the second silicon layer 117a is exposed through the trenches 125.

Figure 1E:
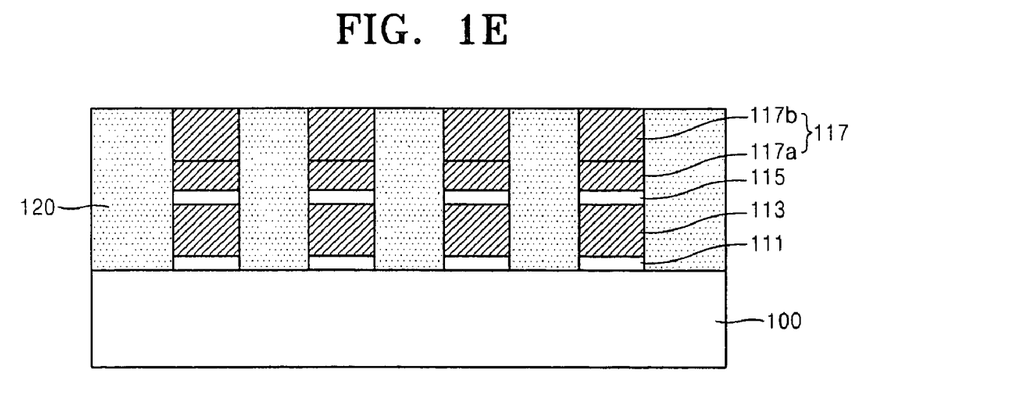

Referring to FIG. 1E, the trenches 125 are filled to form the third silicon layer 117b, thereby forming a silicon layer 117. The third silicon layer 117b may be formed by depositing polysilicon on the entire surface of the semiconductor substrate 100 and then performing CMP on the polysilicon by using the first interlayer dielectric layer 120 as an etch-stop layer. Alternatively, the silicon layer 117 may be formed by selectively growing epitaxial silicon in the trenches 125 according to a Selective Epitaxial Growth (SEG) technique and then performing CMP on the grown epitaxial silicon by using the first interlayer dielectric layer 120 as the etch-stop layer.

Figure 1F:
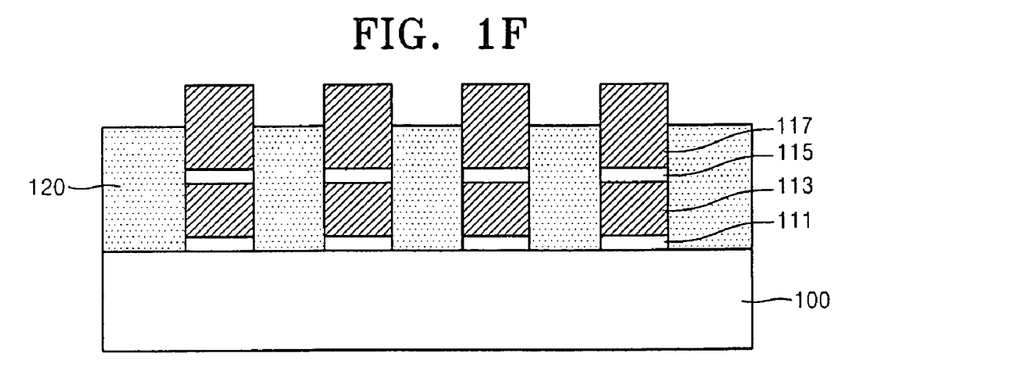

Referring to FIG. 1F, the first interlayer dielectric layer 120 is recessed to expose parts of the side surfaces of the silicon layer 117. The first interlayer dielectric layer 120 may be recessed by etchback. In the present embodiment, parts of the side surfaces of the silicon layer 117 for control gates are exposed; however, the inventive concept is not limited thereto, and thus, in another embodiment, the entire side surfaces of the silicon layer 117 may be exposed.

Figure 1G:
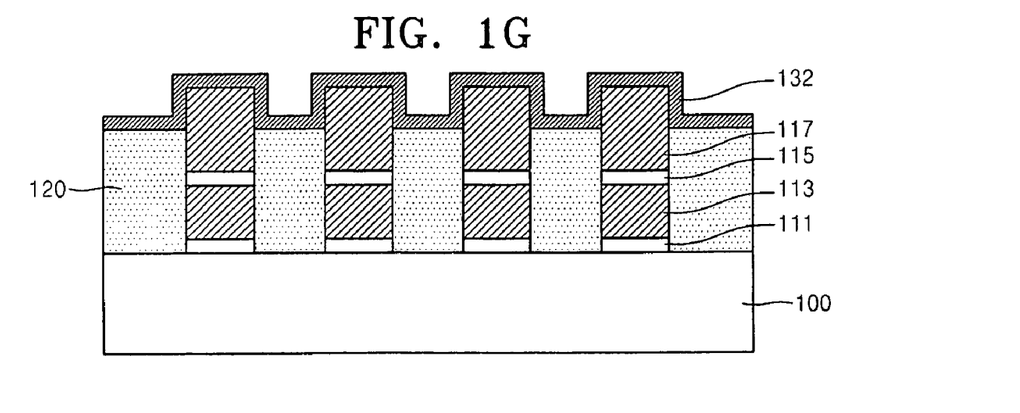

Referring to FIG. 1G, a metal layer 132 is formed on the entire surface of the semiconductor substrate 100 on which parts of the side surfaces of the silicon layer 117 are exposed. The metal layer 132 may be formed of a material such as Co, Ni, Ti, Hf, NiTa, or NiPt, or a mixture of two or more of the foregoing materials. The metal layer 132 may be formed by physical vapor deposition (PVD), chemical vapor deposition (CVD), or atomic layer deposition (ALD).

Figure 1H:
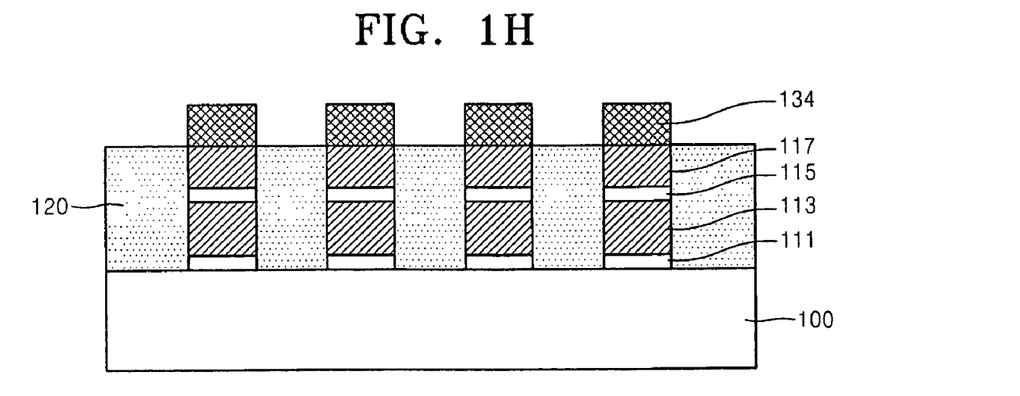

Referring to FIG. 1H, the semiconductor substrate 100 on which the metal layer 132 has been formed is thermally treated to form a metal silicide layer 134 on the silicon layer 117. The metal silicide layer 134 may be formed according to a two-stage thermal treatment process, or a thermal treatment process having three or more stages. Remaining portions of the metal layer 132 that do not react with the silicon layer 117 during the silicidation reaction are removed. Since the metal layer 132 contacts the top surfaces and the parts of the side surfaces of the silicon layer 117, the metal silicide layer 134 may be evenly formed on the silicon layer 117. In the present embodiment illustrated in FIG. 1H, only a part of the silicon layer 117 reacts with the metal layer 132 to form the metal silicide layer 134, and the remaining portion of the silicon layer 117 does not undergo a silicidation reaction and thus remains as the silicon layer 117. Accordingly, in the present embodiment, a control gate is a stack of the remaining portion of the silicon layer 117 and the metal silicide layer 134; however, the inventive concept is not limited thereto, and thus, in another embodiment, the entire silicon layer 117 may undergo a silicidation reaction with the metal layer 132, and thus the control gate may be made up of only the metal silicide layer 134. In another embodiment, to prevent oxidation of the metal layer 132, a capping layer (not shown), for example, a TiN capping layer, may be further formed on the metal layer 132 to prevent oxidation, and cause a silicidation reaction so as to form the metal silicide layer 134. The capping layer may be removed together with the metal layer 132 when the metal layer 132 is removed.

Thereafter, although not shown in the drawings, a second interlayer dielectric layer is formed on the semiconductor substrate 100 on which the metal silicide layer 134 has been formed, and metal wires are formed, thereby completing the manufacture of the flash memory.

FIGS. 2A through 2E are cross-sectional views illustrating a method of forming a control gate of a flash memory, according to another embodiment of the inventive concept.

The present embodiment illustrated in FIGS. 2A through 2E is different from the one illustrated in FIGS. 1A through 1H in that a hard mask layer 119 is directly formed on the intergate dielectric layer 115, as opposed to forming the second silicon layer 117a on the integrate dielectric layer 115. Like reference numerals in FIGS. 2A through 2E and FIGS. 1A through 1H denote like elements, and thus their description will be omitted.

Figure 2A:
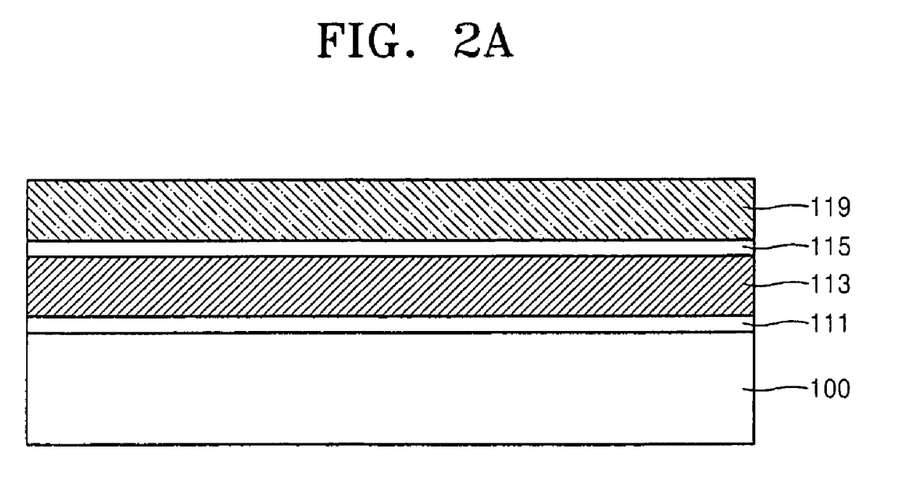
FIGS. 2A through 2E are cross-sectional views illustrating a method of forming a control gate of a flash memory, according to another embodiment of the inventive concept.

Referring to FIG. 2A, the tunnel dielectric layer 111, the first silicon layer 113, the intergate dielectric layer 115, and the hard mask layer 119 are sequentially formed on the semiconductor substrate 100 in the order stated. The tunnel dielectric layer 111 may be formed of silicon oxide by thermal treatment or CVD, or formed of a material having a low dielectric constant. The intergate dielectric layer 115 may be an ONO layer, which is a stack of a silicon oxide layer, a silicon nitride layer, and a silicon oxide layer. The first silicon layer 113 may be formed of polysilicon. The hard mask layer 119 may be formed of a material having etching selectivity to silicon or a silicon oxide layer, for example, silicon nitride. The hard mask layer 119 may be formed to have a height equal to the height of a control gate.

Figure 2B:
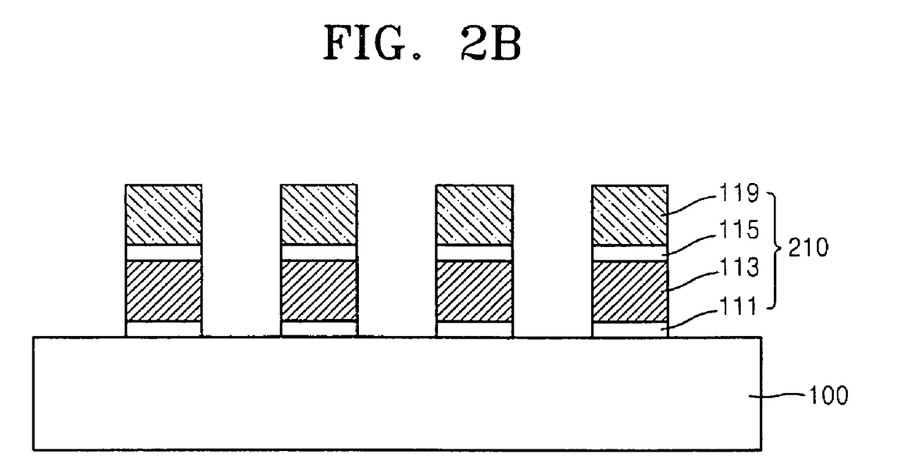

Referring to FIG. 2B, the tunnel dielectric layer 111, the first silicon layer 113, the intergate dielectric layer 115, and the hard mask layer 119 are patterned to form stacked gate structures 210. At this time, the hard mask layer 119 may be first patterned, and then the remaining stacked layers below the hard mask layer 119 may be etched using the patterned hard mask layer 119 as an etch mask. The hard mask layer 119 may also serve as a sacrificial pattern when forming the control gates, after serving as the etch mask to form the stacked gate structures 210.

Figure 2C:
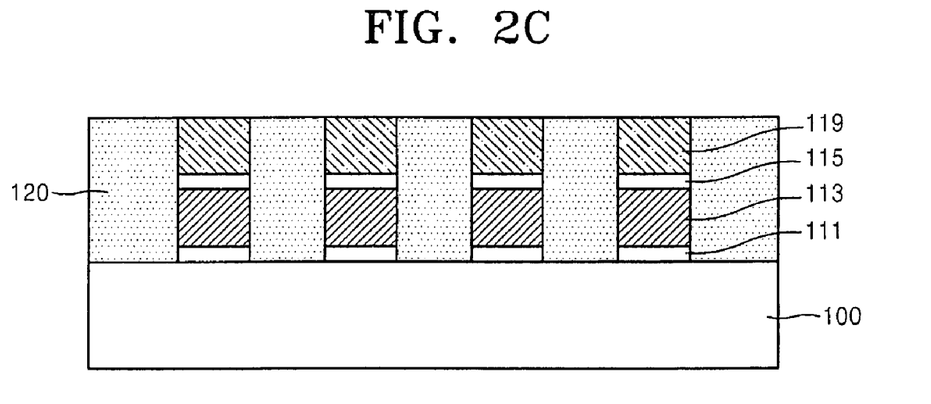

Similar to FIG. 1C, referring to FIG. 2C, the first interlayer dielectric layer 120 is formed between stacked gate structures 210. In the present embodiment, since the second silicon layer 117a is not formed, the heights of the stacked gate structures 210 are decreased as compared to those of the stacked gate structures 110, and thus the depths of spaces between stacked gate structures 210 are also decreased as compared to those between the stacked gate structures 110. Therefore, when the first interlayer dielectric layer 120 is formed between the stacked gate structures 210, overhangs are not generated, and thus voids are not formed within the first interlayer dielectric layer 120.

Figure 2D:
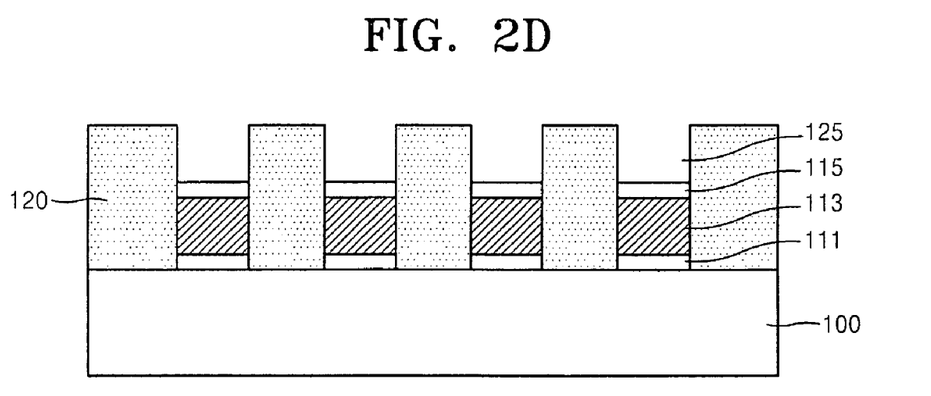

Referring to FIG. 2D, the hard mask layer 119 exposed on the top surface of the first interlayer dielectric layer 120 is removed. The hard mask layer 119 may be selectively removed according to a wet etching method using phosphoric acid. When the hard mask layer 119 is removed, trenches 125 are formed in the first interlayer dielectric layer 120, and the top surface of the intergate dielectric layer 115 is exposed through the trenches 125.

Figure 2E:
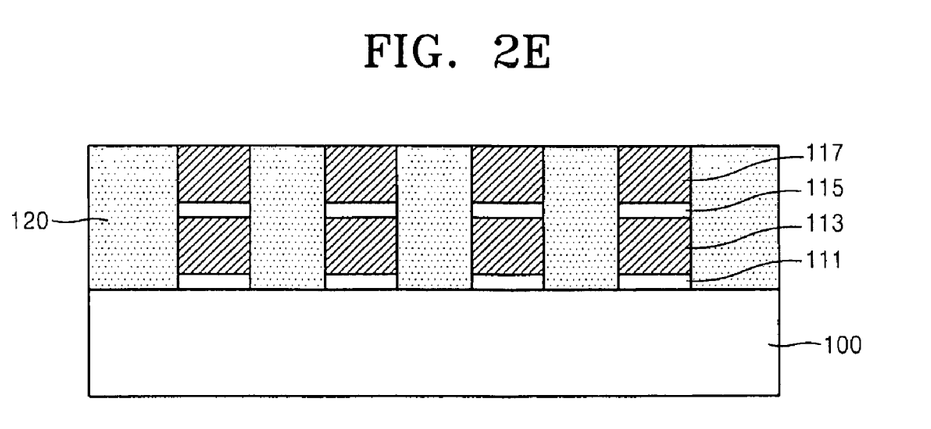

Referring to FIG. 2E, the silicon layer 117 is formed in the trenches 125. The silicon layer 117 may be formed by depositing polysilicon on the entire surface of the semiconductor substrate 100 and then performing CMP on the deposited polysilicon by using the first interlayer dielectric layer 120 as an etch-stop layer.

A subsequent operation of forming a metal silicide layer of a control gate is the same as described for FIGS. 1F through 1H.

In the above-described embodiments of the inventive concept, it will be understood that the first silicon layer 113, the second silicon layer 117a, the third silicon layer 117b, and the silicon layer 117 are all conductive silicon layers.

In the above-described embodiments of the inventive concept, a method of forming a control gate of a floating gate type flash memory has been illustrated. However, the inventive concept may be applied to a method of forming a control gate of a charge trap type flash memory and further to a method of forming an upper gate electrode of a stacked gate structure.

While the inventive concept has been particularly shown and described with reference to exemplary embodiments thereof, it will be understood that various changes in form and details may be made therein without departing from the spirit and scope of the following claims.

What is claimed is:

1. A method of forming a nonvolatile memory device, comprising:
    forming a preliminary stacked gate structure on a semiconductor substrate, said preliminary stacked gate structure comprising a tunnel dielectric layer, a floating gate electrode on the tunnel dielectric layer, an intergate dielectric layer on the floating gate electrode and a sacrificial hard mask layer on the intergate dielectric layer;
    forming an interlayer dielectric layer on opposing sidewalls of the preliminary stacked gate structure; then
    removing the sacrificial hard mask layer to define a recess in the preliminary stacked gate structure that exposes sidewalls of the interlayer dielectric layer; then
    forming a silicon layer in the recess and directly on the intergate dielectric layer and exposed sidewalls of the interlayer dielectric layer, to thereby define a stacked gate structure comprising the tunnel dielectric layer, the floating gate electrode, the intergate dielectric layer and the silicon layer.

2. The method of claim 1, further comprising converting at least a portion of the silicon layer into a metal silicide layer.

3. A method of forming a nonvolatile memory device, comprising:
    forming a preliminary stacked gate structure on a semiconductor substrate, said preliminary stacked gate structure comprising a tunnel dielectric layer, a floating gate electrode on the tunnel dielectric layer, an intergate dielectric layer on the floating gate electrode and a sacrificial hard mask layer on the intergate dielectric layer;
    forming an interlayer dielectric layer on opposing sidewalls of the preliminary stacked gate structure; then
    removing the sacrificial hard mask layer to define a recess in the preliminary stacked gate structure that exposes sidewalls of the interlayer dielectric layer; then
    forming a silicon layer in the recess and directly on the intergate dielectric layer, and exposed sidewalls of the interlayer dielectric layer to thereby define a stacked gate structure comprising the tunnel dielectric layer, the floating gate electrode, the intergate dielectric layer and the silicon layer; and
    converting at least a portion of the silicon layer into a metal silicide layer by:
        etching back the interlayer dielectric layer to expose sidewalls of the silicon layer; and
        depositing a metal layer on the exposed sidewalls of the silicon layer.

4. The method of claim 3, wherein said converting further comprises thermally treating the metal layer and the silicon layer to convert portions of the metal layer and silicon layer into the metal silicide layer.

5. The method of claim 4, wherein the metal layer comprises a metal selected from a group consisting of cobalt, nickel, titanium, hafnium, nickel tantalum and nickel platinum.

6. A method of forming a nonvolatile memory device, comprising:
    forming a preliminary stacked gate structure on a semiconductor substrate, said preliminary stacked gate structure comprising a tunnel dielectric layer, a floating gate electrode on the tunnel dielectric layer, an intergate dielectric layer on the floating gate electrode, a first silicon layer on the intergate dielectric layer and a sacrificial hard mask layer on the first silicon layer;
    forming an interlayer dielectric layer on opposing sidewalls of the preliminary stacked gate structure; then
    removing the sacrificial hard mask layer to define a recess in the preliminary stacked gate structure that exposes the first silicon layer; then
    forming a second silicon layer in the recess to thereby define a stacked gate structure comprising the tunnel dielectric layer, the floating gate electrode, the intergate dielectric layer and the first and second silicon layers.

7. The method of claim 6, wherein forming a second silicon layer comprises epitaxially growing the second silicon layer using the first silicon layer as a seed layer.

8. The method of claim 7, further comprising planarizing the epitaxially grown second silicon layer using the interlayer dielectric layer as a planarization stop layer.

9. The method of claim 6, wherein said removing is preceded by planarizing the interlayer dielectric layer using the sacrificial hard mask layer as a planarization stop layer.

10. The method of claim 6, further comprising converting at least a portion of the second silicon layer into a metal silicide layer.

11. The method of claim 10, wherein said converting comprises:
    etching back the interlayer dielectric layer to expose sidewalls of the second silicon layer; and
    depositing a metal layer on the exposed sidewalls of the second silicon layer.

12. The method of claim 10, wherein said converting comprises:
    etching back the interlayer dielectric layer to expose sidewalls of the second silicon layer;
    depositing a metal layer on the exposed sidewalls of the second silicon layer; and
    thermally treating the metal layer and the second silicon layer to convert portions of the metal layer and second silicon layer into the metal silicide layer.

13. The method of claim 12, wherein the metal layer comprises a metal selected from a group consisting of cobalt, nickel, titanium, hafnium, nickel tantalum and nickel platinum.

14. A method of forming a gate electrode of a semiconductor device, the method comprising:
    forming a plurality of stacked structures each comprising a tunnel dielectric layer, a first silicon layer for floating gates, an intergate dielectric layer, a second silicon layer for control gates, and a hard mask layer, on a semiconductor substrate in the stated order;
    forming a first interlayer dielectric layer between the plurality of stacked structures so that a top surface of the hard mask layer is exposed;
    selectively removing the hard mask layer of which the top surface is exposed in the first interlayer dielectric layer; and
    forming a third silicon layer for control gates in an area from which the hard mask layer was removed to form a composite silicon layer for control gates which comprises the third silicon layer and the second silicon layer.

15. The method of claim 14, further comprising:
    recessing the first interlayer dielectric layer so that an upper portion of the composite silicon layer protrudes over the first interlayer dielectric layer; and
    forming a metal silicide layer on the upper portion of the composite silicon layer.

16. The method of claim 14, further comprising:
    recessing the first interlayer dielectric layer so that an upper part of the composite silicon layer protrudes over the first interlayer dielectric layer; and
    turning the composite silicon layer into a metal silicide layer.

17. The method of claim 14, wherein the forming of the plurality of stacked structures comprises:
- sequentially forming a first dielectric layer, a first silicon layer, a second dielectric layer, a second silicon layer, and a mask layer on the semiconductor substrate in the stated order;
- forming the mask pattern by patterning the mask layer; and
- etching the first dielectric layer, the first silicon layer, the second dielectric layer, and the second silicon layer by using the mask pattern as an etch mask, so as to form the tunnel dielectric layer, the first silicon layer, the intergate dielectric layer, and the second silicon layer.

18. The method of claim 17, wherein the first dielectric layer comprises a silicon oxide layer, the second dielectric layer comprises an oxide-nitride-oxide (ONO) layer, and the mask layer comprises a silicon nitride layer.

19. The method of claim 14, wherein the forming of the first interlayer dielectric layer comprises:
- depositing a dielectric material for the first interlayer dielectric layer in spaces between the plurality of stacked structures so as to fill the spaces between the plurality of stacked structures: and
- performing chemical mechanical polishing (CMP) on the deposited dielectric material for the first interlayer dielectric layer by using the mask pattern as a CMP stop layer.

20. The method of claim 14, wherein the first interlayer dielectric layer comprises one of a Medium Temperature Oxide (MTO) layer and a Tetra-Ethyl-Ortho-Silicate TEOS) oxide layer.

* * * * *